(12) United States Patent
Grafe et al.

(10) Patent No.: US 7,352,057 B2
(45) Date of Patent: Apr. 1, 2008

(54) SEMICONDUCTOR MODULE HAVING AN INTERNAL SEMICONDUCTOR CHIP STACK, AND METHOD FOR PRODUCING SAID SEMICONDUCTOR MODULE

(75) Inventors: Jurgen Grafe, Dresden (DE); Sylke Ludewig, Dresden (DE); Jochen Thomas, Munich (DE); Peter Weitz, Sauerlach (DE)

(73) Assignee: Infineon Technologies AG, Munich (DE)

( * ) Notice: Subject to any disclaimer, the term of this patent is extended or adjusted under 35 U.S.C. 154(b) by 152 days.

(21) Appl. No.: 11/245,920

(22) Filed: Oct. 7, 2005

(65) Prior Publication Data

US 2006/0091518 A1     May 4, 2006

(30) Foreign Application Priority Data

Oct. 8, 2004 (DE) .................... 10 2004 049 356

(51) Int. Cl.
*H01L 23/02* (2006.01)
*H01L 21/44* (2006.01)

(52) U.S. Cl. ...................... 257/686; 438/109
(58) Field of Classification Search ................ 257/686, 257/696, 758, E25.031–E25.032; 438/108–110
See application file for complete search history.

(56) References Cited

U.S. PATENT DOCUMENTS 6,686,663 B2 * 2/2004 Masuda et al. ............. 257/777

6,900,528 B2 * 5/2005 Mess et al. ................. 257/686

FOREIGN PATENT DOCUMENTS

| JP | 2002/033442 | * | 1/2002 |
| JP | 2002033442 | | 1/2002 |
| JP | 2004214285 | | 7/2004 |

* cited by examiner

*Primary Examiner*—Calvin Lee
(74) *Attorney, Agent, or Firm*—Dicke, Billig, Czaja, PLLC

(57) ABSTRACT

A semiconductor module having an internal semiconductor chip stack on a wiring substrate is disclosed. In one embodiment, the semiconductor chip stack has semiconductor chips which are arranged such that they are offset, the semiconductor chips having bonding connection pads in at least one edge region of their active top side. These bonding connection pads are electrically connected to the wiring substrate via bonding connections. In this case, the semiconductor chips are stacked on top of one another in an offset manner such that the bonding connection pads remain free of a semiconductor chip which is stacked on top of them. In this case, the semiconductor chips may be identical silicon chips which may differ, for example in pairs, in terms of their wiring structure for the centrally arranged contact areas in different edge regions.

9 Claims, 3 Drawing Sheets

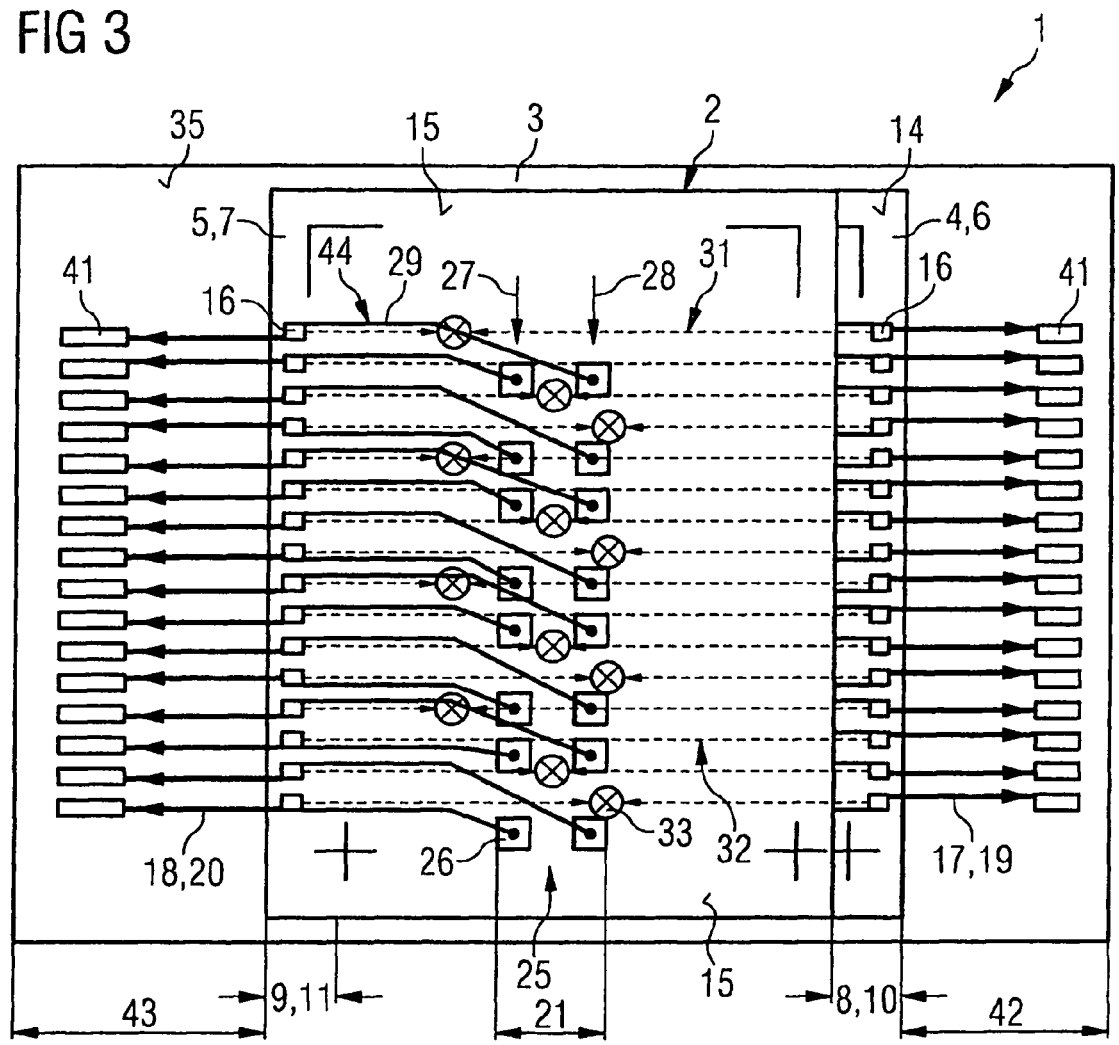

US 7,352,057 B2

SEMICONDUCTOR MODULE HAVING AN INTERNAL SEMICONDUCTOR CHIP STACK, AND METHOD FOR PRODUCING SAID SEMICONDUCTOR MODULE

CROSS-REFERENCE TO RELATED APPLICATIONS

This Utility Patent Application claims priority to German Patent Application No. DE 10 2004 049 356.1-33, filed on Oct. 8, 2004, which is incorporated herein by reference.

FIELD OF THE INVENTION

The invention relates to a semiconductor module having an internal semiconductor stack, and to a method for producing said semiconductor module.

BACKGROUND

It is already widespread practice, in mobile radio technology, to stack internal semiconductor chips in a component housing, for example for stacked FBGA (fine pitch ball grid array) semiconductor chip sets in "MCP" (multiple chip packages) housings. Internal chip stacks of 3 or 4 semiconductor chips of this type are likewise intended. However, stacked chips in the housing are not customary in the production of DRAM memories (direct access memories). One reason for this is, above all, the special arrangement of the contact areas on the active top side of semiconductor chips of this type in a central middle region, with it being possible for the central middle region to comprise a plurality of rows of contact areas. This central middle region makes it more difficult to stack semiconductor chips of this type in an internal chip stack.

In an attempt to solve this problem, additional rewiring structures are known, said rewiring structures providing additional interconnects on rewiring films and/or rewiring plates on the top sides of memory chips of this type, these interconnects leading from the central region to bonding surfaces in the edge region of the semiconductor chips, so that bonding connections to corresponding substrates can be provided from there. However, if the semiconductor chips which are to be stacked on top of one another are of an identical size, this results in the disadvantage that additional spacer plates have to be provided for the internal chip memory in order to be able to provide the bonding surfaces (which are arranged in the edge regions) with bonding connections. As a result, the space requirement and, in particular, the height of the semiconductor component become excessively large, particularly when stacking more than two semiconductor chips in an internal semiconductor chip stack. Consequently, there is a need to allow all bonding connections to the semiconductor chips which are to be stacked, without considerably increasing the space requirement and thus the height of the semiconductor component. For these and other reasons, there is a need for the present invention.

SUMMARY

The present invention provides semiconductor module having an internal semiconductor chip stack on a wiring substrate. In one embodiment, the module includes a plurality of semiconductor chips which are arranged such that they are offset, each semiconductor chip including an active side, and one or more bonding connection pads in at least one edge region of their active side, the bonding connection pad are coupled to the wiring substrate via bonding connections. The semiconductor chips are stacked on top of one another in an offset manner such that the bonding connection pads remain free of a semiconductor chip which is stacked on top of them.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates a schematic plan view of a semiconductor module illustrated in FIG. 1 with a line layout within the semiconductor module.

DETAILED DESCRIPTION

Figure 1:
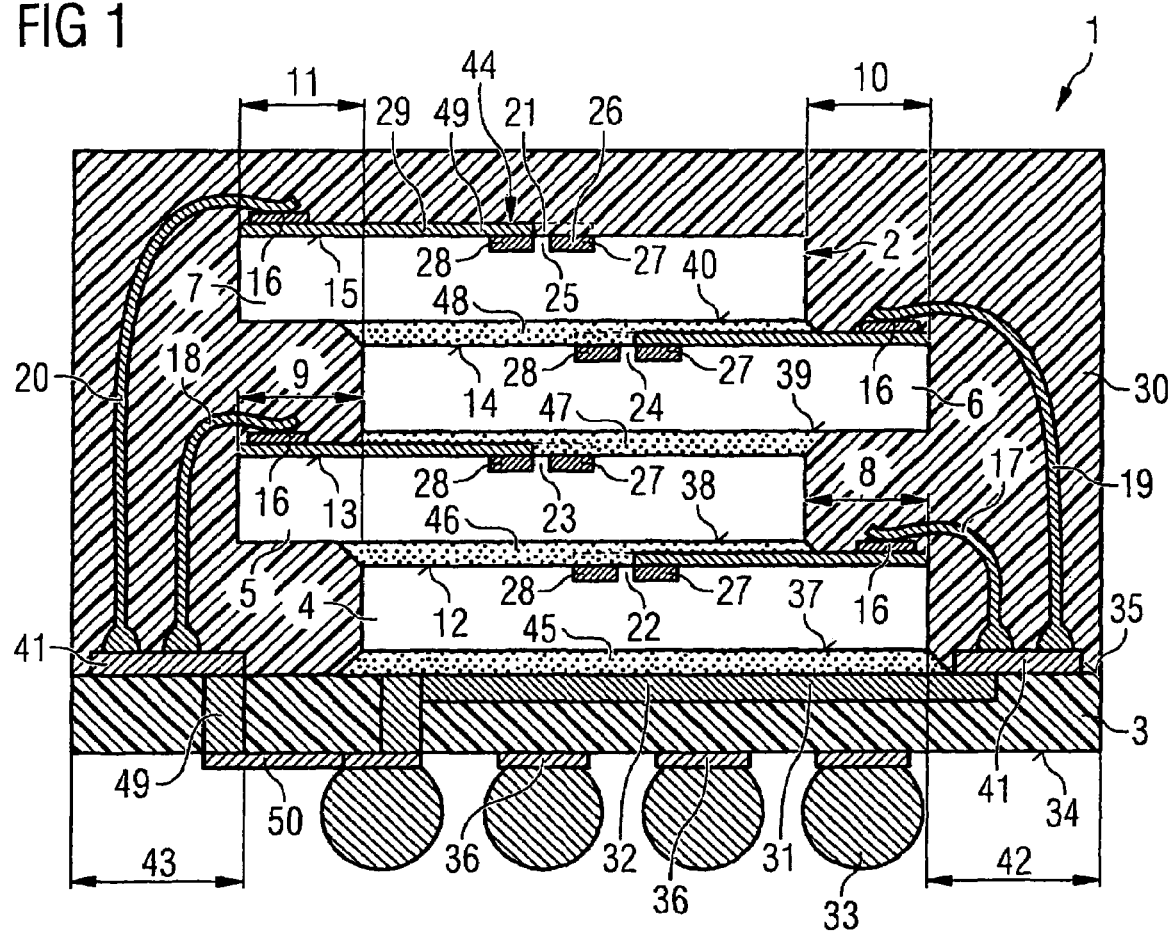
FIG. 1 illustrates a schematic cross section through a semiconductor module in a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention to provide a semiconductor module having an internal semiconductor chip stack for high storage densities, in which semiconductor memory chips having a storage capacity of several gigabits can be combined with one another to form a compact semiconductor component despite having contact areas in the central region.

In one embodiment, the invention provides a semiconductor module having an internal semiconductor chip stack on a wiring substrate, said semiconductor chip stack comprising semiconductor chips which are stacked on top of one another and have a top semiconductor chip and at least one bottom semiconductor chip. The semiconductor chips include, on their active top side, an additional wiring structure with a multilayer metal coating. The metal coating is patterned and comprises interconnects between contact areas in a central middle region and bonding connection pads in edge regions of the semiconductor chip. The additional wiring structure is used to configure originally identical semiconductor chips on a semiconductor wafer in such a manner that the contact areas which were originally arranged centrally in the central region are rewired to bonding connection pads in edge regions. The bonding connection pads are electrically connected to the wiring substrate via bonding connections. To this end, the semiconductor chips are stacked in an offset manner with respect to one another such that the bonding connection pads remain free of a semiconductor chip which is stacked on top of them in the internal semiconductor chip stack.

This semiconductor module (preferably having stacked DRAMs) has the advantage that semiconductor chips having an identical two-dimensional extent can be stacked in the internal semiconductor chip stack without spacer plates being required between the semiconductor chips in order to keep the bonding connection pads free. Arranging the semiconductor chips in an offset manner in the semiconductor chip stack slightly increases the two-dimensional extent of the overall component but advantageously minimizes its height, especially since the back of a semiconductor chip can be fixed directly to a semiconductor chip which is arranged underneath it.

In one preferred embodiment of the invention, the interconnects on the semiconductor chips comprise a plurality of metal layers. A middle layer which absorbs the greatest current load has copper or a copper alloy. A layer which comprises tungsten/titanium is arranged, as the bottom layer, on the passivation layer made of a polyimide, for example. This layer which has tungsten/titanium forms a diffusion barrier on the metallized contact areas of the semiconductor chip and protects the metal (for example aluminum) of the contact areas from the penetration of copper. A noble metal layer forms the topmost metal layer. A layer of nickel is arranged as a diffusion barrier between the copper layer and the noble metal layer. In order to improve adhesion and corrosion resistance, a palladium intermediate layer can also be provided. The design of the semiconductor chips may correspond to the memory chips based on DRAM technology and/or GDRAM (graphic dynamic random access memory) technology, as described above. A compact solution for producing semiconductor modules having an internal chip stack is thus also possible for these problematic semiconductor chips.

Different line routing on the top sides of the semiconductor chips makes it possible to compensate for different bonding wire lengths. With different line routing on both sides of the central region, the additional wiring structure thus makes it possible to match input and output impedances and avoid delay time differences.

In order to protect the internal semiconductor chip stack with its bonding connections, it is embedded in a plastic housing composition.

The semiconductor chips in the internal semiconductor chip stack are preferably stacked on top of one another such that they are offset on one side, and have bonding connection pads in an individual edge region of the top side of the respective semiconductor chip. An offset arrangement of this type on one side results in staircase stacking which results in it being necessary to fit all of the bonding connections on one side of the semiconductor substrate. This has the advantage that all of the bonding connection areas on the semiconductor chips (which are stacked such that they are offset on one side) are available for the purpose of bonding bonding wires after the semiconductor chips have been fixed to one another. It also has the advantage that, as a result of the stepped arrangement, the bonding surfaces are respectively supported in a sturdy manner during the bonding process by the semiconductor chips which are arranged underneath them.

In another embodiment of the invention, the semiconductor chips are stacked on top of one another such that they are offset on alternate sides, and an individual edge region of the top side of the respective semiconductor chip comprises bonding connection pads. In this embodiment of the invention, the thickness of one of the semiconductor chips which are arranged such that they are offset on alternate sides is respectively available for forming the bonding connections without having to arrange additional spacer plates between the semiconductor chips. However, when producing an internal semiconductor chip stack of this type, it needs to be taken into account that the third semiconductor chip which is to be stacked in the internal semiconductor chip stack and all further semiconductor chips which are to be stacked in the internal semiconductor chip stack can be fitted only when the first two semiconductor chips have been provided with bonding connections. Taking this prerequisite into account makes it possible, in principle, for any desired number of semiconductor chips to be stacked on top of one another without the semiconductor chips being offset in the manner of a staircase and without having to provide spacer plates.

In another embodiment of the invention, it is possible to stack the semiconductor chips on top of one another such that they are diagonally offset. To this end, the bonding connection pads may be arranged in two edge regions (which are arranged at an angle to one another) of the top side of the respective semiconductor chip. In this case too, the result of stacking is that semiconductor chips follow one another in a stepped manner, with the advantage again residing in the fact that the two edge regions (which are arranged at an angle to one another) of each of the semiconductor chips are available for bonding purposes even after four or more semiconductor chips have been applied to one another.

If DRAM semiconductor chips or GDRAM semiconductor chips, which comprise a central middle region having contact areas which are arranged in a plurality of rows on the top sides of the semiconductor chips, are stacked on top of one another, the bonding connection pads are routed, for the purposes of stacking the semiconductor chips such that they are offset on alternate sides, to one of the edge regions of the semiconductor chips by means of wiring using interconnects, so that each of the contact areas in a central bonding channel is connected, by these bonding connection pads in the edge region, to bonding connection pads in the edge region of the semiconductor chips.

In order to compensate for the different lengths of the bonding connections from the semiconductor chips in the semiconductor chip stack to the wiring substrate, the wiring substrate includes, in one preferred embodiment of the invention, a multilayer wiring structure which leads to common external contacts on the underside of the wiring substrate via interconnects of differing length within the wiring substrate. The different lengths of the bonding connections to the stacked semiconductor chips which are arranged such that they are offset on alternate sides are thus compensated for in such a manner that delay time differences on account of different lengths of the signal paths within the semiconductor module having an internal chip stack are advantageously compensated for in such a manner that signal distortion is avoided.

In another preferred embodiment of the invention, the internal semiconductor chip stack comprises memory components, preferably DRAMs, having storage capacities in the region of several gigabits and a data transfer range of several hundred megahertz. In addition, the internal chip stack may comprise at least one logic chip, preferably a microprocessor, for driving the memory chips.

In another embodiment, the present invention provides a method for producing one or more semiconductor modules having an internal semiconductor chip stack which has semiconductor chips which are stacked on top of one another and comprise a top semiconductor chip and at least one bottom semiconductor chip. The method includes a semiconductor wafer having semiconductor chips which include at least one row of contact areas in a central middle region of their active top sides is produced. An additional wiring structure having a multilayer metal coating is applied to this semiconductor wafer. This multilayer metal coating is provided with interconnects between the contact areas in the central middle region and bonding connection pads in edge regions of the semiconductor chips on the semiconductor wafer.

The additional wiring structure is thus used to configure the originally identical semiconductor chips on the semiconductor wafer in such a manner that their contact areas which were originally arranged centrally in the central region are rewired toward the edge. One advantage of this method is that, despite the centrally arranged contact areas, standard semiconductor memory chips can now preferably be stacked. In addition, the additional wiring structure leads to edge regions which are arranged opposite one another and have a different configuration, thus advantageously making it possible to compensate for delay time differences.

A wiring strip which comprises a plurality of semiconductor module positions and has, on its underside, external contact areas for external contacts of the semiconductor modules is produced in parallel with the production of the semiconductor chip. The respective external contact area of this wiring substrate strip is electrically connected to a wiring structure at each of the semiconductor component positions within the wiring substrate strip.

Bottom semiconductor chips having bonding connection pads which are arranged in at least one edge region are then arranged at the semiconductor module positions. Bonding connections are then produced, at the semiconductor module positions, between bonding connection pads on the respective bottom semiconductor chip and the respective wiring structure of the wiring substrate strip.

One or more top semiconductor chips whose backs are partially fixed to active top sides of the respective semiconductor chips arranged underneath them are then stacked such that they are offset on alternate sides. In this case, the bonding connection pads of the bonding connections which have already been made on the semiconductor chips which are arranged underneath them are left free. After each application of additional semiconductor chips, bonding connections are produced between the bonding connection pads at the edge of the stacked semiconductor chip and the wiring structure.

After the internal semiconductor chip stack and its bonding connections to the wiring structure on the wiring substrate strip have been produced, the semiconductor chip stacks and the bonding connections are embedded in a plastic housing composition on the wiring substrate strip to form a semiconductor module plate. External contacts are then applied to external contact areas at the semiconductor module positions on the underside of the wiring strip. The semiconductor module plate can be separated into individual semiconductor modules.

One implementation of the method provides for stacked semiconductor chips to be provided, in advance, with a wiring structure comprising interconnects which electrically connect contact areas on the top side of the semiconductor chips to bonding connection pads in at least one edge region of the active top side of the semiconductor chip. Contact areas on the semiconductor chips are thus routed from the central middle region to the edge region of the semiconductor chip. However, unlike in conventional technology, the bonding connection pads are routed either to a left-hand side or to a right-hand side of the semiconductor chips in order to make it possible to stack the semiconductor chips such that they are offset on alternate sides.

To this end, the differences in the line lengths, which differences result on account of the bonding wire connections from the chip edge regions on different sides of the substrate, can be minimized by fitting the external connection pads to the underside of the substrate approximately in the center of the substrate. This optimally reduces the delay time differences of the signals. In addition, meandering interconnect routing on the substrate or the use of further substrate levels can further improve delay time compensation.

Arranging semiconductor chips such that they are offset on alternate sides in order to form an internal semiconductor chip stack and simultaneously ensuring that only one edge of each semiconductor chip is provided with bonding connection pads makes it possible to accommodate any desired number of semiconductor chips in the semiconductor chip stack using this method. Between two and four semiconductor chips within a semiconductor chip stack are optimal in this context, of which a plurality of memory semiconductor chips having a storage capacity $S_c$ of $0.5 \text{ Gbit} \leq S_c \leq 4$ Gbit are preferably contained in the semiconductor chip stack.

If the parasitic capacitances can be kept under control, an identical wiring structure is also possible on each chip, said wiring structure simultaneously routing the central contact areas to the right and to the left so that one of the two rows of bonding contact areas can be selectively provided with bonding connections if these semiconductor chips are stacked. As long as the overhang of the semiconductor chips is within customary values when keeping the bonding contact areas free when the semiconductor chips are being stacked such that they are offset on alternate sides, it is entirely possible to bond the overhang of the semiconductor chips, with the result that a stepped arrangement by offsetting the semiconductor chips on one side on top of one another can be dispensed with.

After the last topmost semiconductor chip has been applied and wire-bonded, the stack is embedded in a plastic housing composition in order to protect it mechanically. As in conventional BGA production, the external contacts can then be fitted in the form of solder balls and, finally, the wiring substrate strip can be separated into individual semiconductor modules. In principle, any desired number of semiconductor chips can be stacked but four semiconductor chips are preferably stacked. Before being stacked, these chips are individually subjected to a cyclothermal "burn-in" test in order to achieve a high yield when stacking the semiconductor chips.

The interconnect routing on the substrate itself and the routing of the signals from two different sides to the external contact areas are characteristic of offsetting the semiconductor chips on the wiring substrate on alternate sides. The signal lengths and thus the conductor path lengths from the external contacts in the form of a solder ball to the bonding connection pads on the semiconductor chips advantageously differ only slightly from one another, so that delay time differences are avoided. The external contacts are accordingly distributed differently on the underside of the wiring substrate, and a multilayer wiring substrate is preferably used in order to have greater opportunities to match the length of the conduction paths to the bonding connections to the semiconductor chips.

FIG. 1 illustrates a cross section through a semiconductor module 1 in one embodiment of the invention. This semiconductor module 1 includes an internal semiconductor chip stack 2 which is arranged on a wiring substrate 3 and is embedded in a plastic housing composition 30. In this embodiment of the invention, the individual semiconductor chips 4, 5, 6 and 7 are arranged in the semiconductor chip stack 2 such that they are offset on alternate sides. To this end, the semiconductor chips 4, 5, 6 and 7 have bonding connection pads 16 in a respective one of their edge regions 8, 9, 10 and 11, with the result that the individual semiconductor chips 4, 5, 6 and 7 are electrically connected to the wiring substrate 3 by these bonding connection pads 16 and bonding connections 17, 18, 19 and 20.

The semiconductor chips 4, 5, 6 and 7 are stacked on top of one another such that they are offset on alternate sides and so that the bonding connection pads 16 remain free and are not covered by a semiconductor chip 5, 6 or 7 stacked on top of them. The spacing (which is required for the bonding connections 17, 18, 19 and 20) between the individual semiconductor chips 4, 5, 6 and 7 is not achieved by inserting additional spacer plates but rather by offsetting the semiconductor chips 4, 5, 6 and 7 on alternate sides. One row of bonding connection pads 16 thus always remains free in the uncovered edge regions 8, 9, 10 and 11 in order to bond the bonding connections 17, 18, 19 and 20 to the corresponding bonding connection pads 16 there.

The bonding connections 17, 18, 19 and 20 which are opposite one another within the semiconductor module 1 are combined and electrically connected to one another using interconnects 32 in the wiring structures 31 and 50 on the top side 35 and on the underside 34 of the wiring substrate 3. To this end, the position of the connected external contacts 33 with corresponding external contact areas 36 is selected in such a manner that the different positions of the bonding connections 41 in the edge regions 42 and 43 on the top side 35 of the substrate 3 are compensated for to the greatest possible extent. This generally leads to the external contacts 33 being arranged centrally.

In this embodiment of the invention, the stacked semiconductor chips 4, 5, 6 and 7 are of an identical size, have an identical internal structure and represent "DRAM" (direct access memory) components. In this case, the DRAM semiconductor chips 4, 5, 6 and 7 have central middle regions 22, 23, 24 and 25 in a central region 21 of the respective semiconductor chip 4, 5, 6 and 7. These central middle regions 22, 23, 24 and 25 have contact areas 26 which are arranged in the rows 27 and 28. These contact areas 26 which are arranged in two rows are routed, for each of the semiconductor chips 4, 5, 6 and 7, on one side from the central region 21 to the edge regions 8, 9, 10 and 11 using interconnects 29 and a corresponding wiring structure 44 on the top sides 12, 13, 14 and 15 of the semiconductor chips 4, 5, 6 and 7, with it being possible for the wiring structures to be patterned differently on both sides of the central region 21.

In order to stack the semiconductor chips 4, 5, 6 and 7 on top of one another, their backs 37, 38, 39 and 40 are bonded to one another using adhesive layers 45, 46, 47 and 48, with the back 37 of the bottom semiconductor chip 4 being directly fixed to the wiring substrate 3, while the top semiconductor chips 5, 6 and 7 are each stacked such that they are offset on alternate sides with respect to the bottom semiconductor chip 4. The adhesive layers 45, 46, 47 and 48 are made of an insulating adhesive in order to avoid short circuits in the wiring structures 44 on the top sides 12, 13, 14 and 15 of the semiconductor chips 4, 5, 6 and 7 and in the wiring structure 31 of the wiring substrate 3.

The wiring substrate 3 comprises edges 42 and 43 whose two-dimensional extent projects beyond the region of the two-dimensional extent of the internal semiconductor chip stack 2, with the result that contact connection pads 41 at which the bonding connections 17, 18, 19 and 20 end can be arranged in the edge regions 42 and 43 of the wiring substrate 3.

The signals from the stacked semiconductor chips 4, 5, 6 and 7 are passed from the contact connection pads 41 to the corresponding external contacts 33 via corresponding interconnects 32 in the wiring structure 31 on the top side 35 of the wiring substrate 3 and via plated-through holes 49 and a wiring structure 50 on the underside 34 of the wiring substrate 3. This interconnect routing on the top side 35 and underside 34 of the wiring substrate 3 makes it possible to compensate for differences in length to the contact areas 26 in the central middle regions 22, 23, 24 and 25 of the semiconductor chips 4, 5, 6 and 7 to such an extent that delay time differences which could distort the signals are minimized.

The storage capacity of the individual semiconductor chips 4, 5, 6 and 7 is in the order of magnitude of several gigabits, preferably between 0.5 and 4 Gbit or larger, with the result that stacking the four semiconductor chips shown in FIG. 1 quadruples the storage capacity of the semiconductor module 1 in comparison with individual DRAM or GDRAM semiconductor components.

Figure 2:
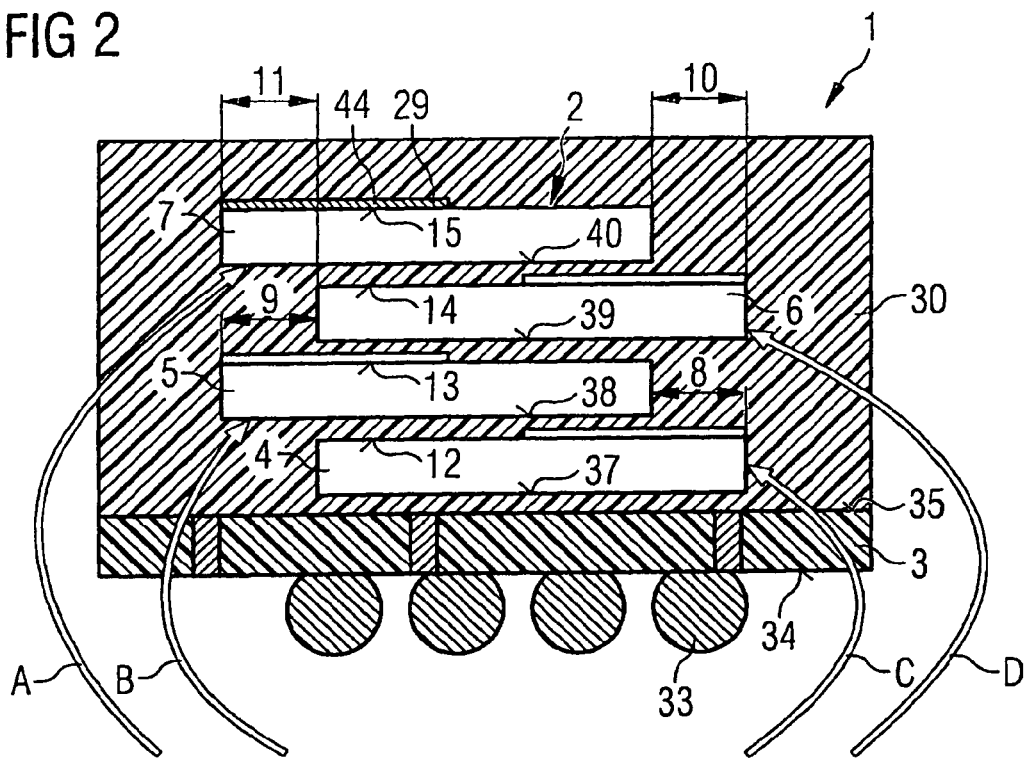
FIG. 2 illustrates a schematic cross section through the semiconductor module illustrated in FIG. 1 with wiring structures of semiconductor chips which are arranged such that they are offset on alternate sides.
Figure 2A:
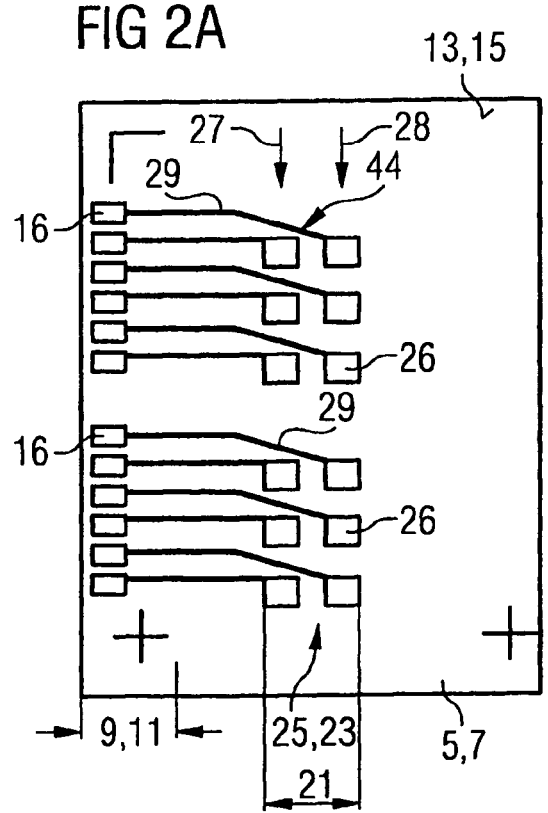

FIG. 2 illustrates a schematic cross section through the semiconductor module 1 illustrated in FIG. 1 with wiring structures 44 of semiconductor chips 4, 5, 6 and 7 which are arranged such that they are offset. Components having the same functions as in FIG. 1 are identified using the same reference symbols and are not additionally discussed. FIG. 2A illustrates a plan view of the semiconductor chips 5 and 7 and illustrates their wiring structure 44. The arrows A and B are used to indicate the positions in the stacked internal semiconductor chip stack 2 at which this wiring structure 44 (as illustrated in FIG. 2A) is arranged. In a central region 21, within central middle regions 23 and 25, the wiring structure 44 comprises two rows 27 and 28 of contact areas 26 on the semiconductor chips 5 and 7, with interconnects 29 being routed on one side from the contact areas 26 to the edge regions 9 and 11 of the semiconductor chips 5 and 7. Bonding connection pads 16, from which bonding connections 18 and 20 extend to corresponding contact connection pads 41 on the wiring substrate 3 (as illustrated in FIG. 1), are arranged in the edge regions 9 and 11.

Figure 2B:
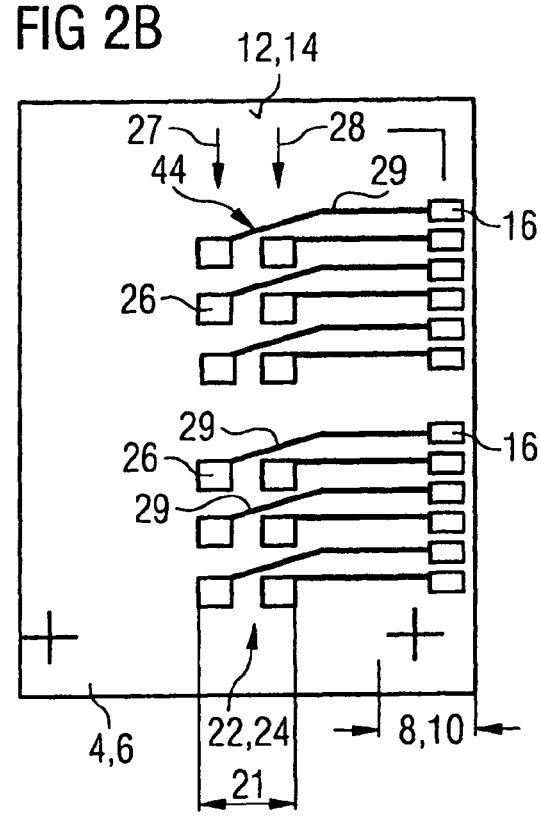

FIG. 2B is used to illustrate the top sides 12 and 14 of the semiconductor chips 4 and 6, the arrangement of which in the internal semiconductor chip stack 2 is indicated by the arrows C and D. The central region 21 of the top sides 12 and 14 of the semiconductor chips 4 and 6 is patterned in a similar manner to that on the semiconductor chip top sides 13 and 15 which are shown in FIG. 2A, but the interconnects 29 now lead to the opposite edge regions 8 and 10 and end there at the bonding connection pads 16, from which bonding connections 17 and 19 again extend to the wiring substrate 3 (as illustrated in FIG. 1).

FIG. 3 illustrates a schematic plan view of a semiconductor module 1 illustrated in FIG. 1 with a line layout within the semiconductor module 1. To this end, the plastic housing composition 30 (as illustrated in FIG. 1) was omitted. Contact connection pads 41 are arranged in the edge regions 42 and 43 of the wiring substrate 3 whose two-dimensional extent is greater than that of the semiconductor chips 4, 5, 6 and 7 which are arranged such that they are offset.

The bonding connections 17 and 19 in the edge region 42 of the wiring substrate 3 and the bonding connections 18 and 20 in the edge region 43 of the wiring substrate 3 are indicated using arrows and extend from the stacked semiconductor chips 4 and 6 and 5 and 7 and their bonding connection pads 16 in the edge regions 8 and 10 and 9 and 11 to the contact connection pads 41 on the top side 35 of the wiring substrate 3.

The interconnects 29 on the topmost semiconductor chip 7 are indicated, using continuous lines, as connecting lines between the contact areas 26 and the bonding connection pads 16. The interconnects 32 which cannot be seen on the top side 35 and underside 34 of the wiring substrate 3 are shown using dashed lines. Arrows on the dashed lines indicate the direction of signals to corresponding plated-through holes 49 which cannot be seen in this plan view and are merely indicated using circles.

Arranging plated-through holes 49 in an offset manner on the underside (not visible here) of the wiring substrate 3 makes it possible to compensate for delay time differences by arranging the external contacts 33 in the central region 21 of the wiring substrate 3. The linear course (illustrated here) of the interconnects 30 within the wiring substrate 3 can be changed as desired by introducing curves or meanders or by using a multilayer wiring substrate 3, so that it becomes possible to compensate exactly for the different lengths between the external contacts 33 and the contacts 41 in the edge region 42 or 43 until the external contacts 33 are reached.

This compensation can also be improved by the lateral bonding connections 17 and 19 and 18 and 20 not ending at common contact connection pads 41 in the edge regions 42 and 43 (as illustrated in FIG. 1) but rather being connected to contact connection pads 41 which are arranged separately on the top side 35 of the wiring substrate 3 so that the length of each bonding connection 17, 18, 19 and 20 can be individually compensated for by the corresponding length of the interconnects 32 in the wiring substrate 3.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module having an internal semiconductor chip stack on a wiring substrate, the semiconductor chip stack comprising:
semiconductor chips which are stacked on top of one another and comprise a top semiconductor chip and at least one bottom semiconductor chip, the semiconductor chips having, on their active top side, an additional wiring structure with a metal coating, which comprises a plurality of metal layers, and with interconnects between contact areas in a central region and bonding connection pads in edge regions, the wiring structure configuring originally identical semiconductor chips in such a manner that the contact areas which were originally arranged centrally in the central region are rewired to bonding connection pads in edge regions, and the bonding connection pads being electrically connected to the wiring substrate via bonding connections, and the semiconductor chips being stacked on top of one another in an offset manner such that the bonding connection pads remain free of a semiconductor chip which is stacked on top of them.

2. The semiconductor module of claim 1, comprising wherein the contact areas are arranged in at least one row, the interconnects extending from these contact areas to one of the edge regions of the semiconductor chip and merging into the bonding connection pads there.

3. The semiconductor module of claim 1, comprising wherein the semiconductor chip stack having the bonding connections to the semiconductor chips is embedded in a plastic housing composition.

4. The semiconductor module of claim 1, comprising wherein the semiconductor chips are stacked on top of one another and configured such that they are offset on one side, and an individual edge region of the top side of the respective semiconductor chip comprises bonding connection pads.

5. The semiconductor module of claim 1, comprising wherein the semiconductor chips are stacked on top of one another such that they are offset on alternate sides, and an individual edge region of the top side of the respective semiconductor chip comprises bonding connection pads.

6. The semiconductor module of claim 1, wherein the semiconductor chips are stacked on top of one another such that they are diagonally offset, and two edge regions which are arranged at an angle to one another of the top side of the respective semiconductor chip comprise bonding connection pads.

7. The semiconductor module of claim 1, wherein the wiring substrate comprises, on its top side, a wiring structure which leads to external contacts on the underside of the wiring substrate via interconnects of differing length within the wiring substrate and thus compensates for the different lengths of the bonding connections to the stacked semiconductor chips which are arranged such that they are offset on alternate sides.

8. The semiconductor module of claim 1, comprising wherein the internal semiconductor chip stack comprises memory components, having storage capacities in the region of several gigabits and a data rate transfer range of several hundred megahertz.

9. The semiconductor module of claim 1, comprising wherein the internal semiconductor chip stack comprises at least one logic chip, preferably a microprocessor.

* * * * *